United States Patent [19]

Shen

[11] Patent Number: 5,702,564
[45] Date of Patent: Dec. 30, 1997

[54] METHOD OF ETCHING CONDUCTIVE LINES WITHOUT UNDERCUTTING

[75] Inventor: Lewis Shen, Cupertino, Calif.

[73] Assignee: Advanced Micro Devices, Inc., Sunnyvale, Calif.

[21] Appl. No.: 368,170

[22] Filed: Jan. 3, 1995

[51] Int. Cl.$^6$ .................................................. H01L 21/302
[52] U.S. Cl. ............................. 156/643.1; 156/656.1; 216/67; 216/77
[58] Field of Search ......................... 156/643.1, 646.1; 216/67, 77

[56] References Cited

U.S. PATENT DOCUMENTS

| | | | |
|---|---|---|---|
| 5,167,762 | 12/1992 | Carr et al. | 156/657 |
| 5,207,868 | 5/1993 | Shinohara | 156/656 |
| 5,211,804 | 5/1993 | Kobayashi | 156/665 |
| 5,350,488 | 9/1994 | Webb | 156/643 |
| 5,387,556 | 2/1995 | Xiaobing et al. | 437/228 |
| 5,411,631 | 5/1995 | Hori et al. | 216/72 |

FOREIGN PATENT DOCUMENTS

| | | |
|---|---|---|
| 0 082 993A3 | 7/1983 | European Pat. Off. . |
| 0 561 402A1 | 9/1993 | European Pat. Off. . |
| 41 30 391A1 | 3/1992 | Germany . |
| 1-220446 | 4/1989 | Japan . |
| 1220446 | 9/1989 | Japan . |
| 7094469 | 4/1995 | Japan . |

OTHER PUBLICATIONS

Suzuki et al., "Residue formation an elimination in chlorine–based plasma etching of Al–Si–Cu interconnections," Journal of Vacuum Science and Technology, Part B, vol. 10, No. 2, pp. 596–600, Mar. 1992.

Suzuki et al., "Residue formation and elimination in chlorine–based plasma etching of Al–Si–Cu Interconnections," Journal of Bacuum Science and Technology, Part B, vol. 10, No. 2, Apr. 1992, pp. 596–600.

Marx et al., "Electron cycloton resonance etching of aluminun alloys with $BCl_3$–$Cl_2$–$N_2$," Journal of Vacuum Science and Technology, Part A, vol. 10, No. 4, Aug. 1992, pp. 1232–1237.

*Primary Examiner*—R. Bruce Breneman
*Assistant Examiner*—Michael E. Adjodha
*Attorney, Agent, or Firm*—Lowe, Price, LeBlanc & Becker

[57] ABSTRACT

Undercutting of conductive lines in a dense array bordered by an open field is avoided by reducing the severity of etching when the conductive material in the open field is substantially removed. In a preferred embodiment, the flow rate of chlorine gas is reduced during high density chlorine plasma etching of a conductive pattern when the conductive material is substantially removed from the open field.

27 Claims, 4 Drawing Sheets

METHOD OF ETCHING CONDUCTIVE LINES WITHOUT UNDERCUTTING

TECHNICAL FIELD

The present invention relates to a method of manufacturing semiconductor devices wherein a dense array of conductive lines is etched without undercutting the conductive lines. The invention has a particular application in manufacturing submicron circuitry using high density chlorine plasma etching.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. This objective becomes particularly difficult to achieve given the economic pressure for high speed production. Thus, the combined requirements of high speed and high density conductive wiring patterns poses a challenge which, to date, has not been satisfactorily achieved.

A traditional method for forming a dense array of conductive lines comprises the use of a subtractive etch back step as the primary metal-patterning technique. This traditional technique basically comprises forming an insulating layer on a substrate, such as monocrystalline silicon, depositing a metal layer, such as aluminum, tungsten, polysilicon, tungsten silicide, or titanium silicide, forming a photo-resist mask having a pattern defining a dense array of conductive lines bordered by an open field wherein the distance between the conductive lines is considerably greater than the distance between conductive lines in the dense array, and etching through the mask. Typically, etching is conducted to optimize production speed as by utilizing an etching apparatus which generates a high density plasma, e.g., a high density chlorine plasma, which involves feeding chlorine gas, along with boron trichloride, into an etching apparatus, such as a Transformer Coupled Plasma (TCP) source type of apparatus. Model 9600, commercially available from Lam Research Corp., Fremont, Calif., has been found suitable. A high density plasma is generated with Cl⁻ as the etching species. Etching is conducted until the metal is substantially removed between the conductive lines of the dense array along with any residues which may have formed, and the underlying oxide etched to ensure complete removal of products between the conductive lines. Other types of etching apparatus, such as other high density plasma source types of apparatus, can be used. For example, etching can also be conducted with an Electron Cycletron Resonance (ECR) type apparatus or a Helicon Resonant Inductive coupled plasma source type apparatus.

A conventional etching technique to form a dense array of conductive lines is shown in FIGS. 1(a) through 1(d). As shown in FIG. 1(a), an oxide layer 10, such as silicon dioxide, is formed on a semiconductor substrate (not shown). A metal layer is then formed on the oxide layer 10. In the depicted prior art embodiment, a barrier layer 11, such as titanium, titanium nitride or titanium-tungsten, is initially formed on oxide layer 10. A second metal layer 12, such as aluminum or an aluminum alloy, is formed on barrier metal layer 11. An anti-reflective coating 13, such as titanium nitride, amorphous silicon, or SiON, is formed on second metal layer 12. There are also commercially available several organic materials suitable for anti-reflective coatings which may be employed. Such organic anti-reflective coatings can be applied either directly to the second metal layer 12 or on subsequently applied photoresist layer 14. The use of barrier layers, second metal layers and anti-reflective coatings are conventional, as are the techniques for depositing the various layers. Accordingly, the function and description of such known components and deposition techniques are not set forth herein in detail.

A photo-resist mask 14 is next formed on the surface of anti-reflective coating 13, which photo-resist mask comprises a pattern 15 defining a dense array of conductive lines bordered by an open field (not shown). With reference to FIG. 1(b), etching is conducted utilizing a high density chlorine plasma 16 generated by an etching apparatus into which chlorine gas is fed at a flow rate of about 50 cc/min. to about 100 cc/min. As shown in FIG. 1(c), high density chlorine plasma etching 16 is continued until all metal and any residues between the conductive lines are removed. Such residues may, for example, comprise silicon and copper which are usually present in typical aluminum alloys employed for forming conductive lines in the semiconductor industry, or Ti or TiN from the barrier layer. Etching is continued until a portion of the underlying oxide layer 10 is removed as shown in FIG. 1(d).

A problem generated by conventional etching practices is undercutting of the conductive lines in the dense array as shown at 17 in FIG. 1(c). We have observed that undercutting is more severe when there is a titanium barrier layer, or when no barrier layer is used, than when a titanium nitride barrier layer is used. However, when a titanium nitride layer is used, undercutting also poses a troublesome problem.

As a result of undercutting, it is very difficult to fill the spaces between the conductive lines, which causes voids where moisture can infiltrate. Moreover, as the lines become progressively narrower, line resistance increases. Undercutting increases the danger of line breaking, thereby reducing the reliability of the device with an attendant high rejection rate. Prior art attempts to resolve the undercutting problem involve adjusting etch recipes; however, the results have not proved satisfactory, particularly in forming high density arrays at high production speeds.

DISCLOSURE OF THE INVENTION

An object of the present invention is a method of manufacturing a semiconductor device having a dense array of conductive lines by etching a conductive layer wherein undercutting of the conductive lines is avoided.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a method of manufacturing a semiconductor device comprising: forming an insulating layer; forming a layer of conductive material on the insulating layer; forming a mask on the conductive layer, which mask contains a pattern comprising a dense array of conductive lines bordered by an open field; etching the conductive layer through the mask with a high density plasma of chlorine generated at a first chlorine gas flow rate until the conductive material is substantially removed between the conductive lines in the open field but conductive material remains in the dense array between the conductive lines; reducing the first chlorine gas flow rate to a second chlorine gas flow rate when the conductive material is substantially completely removed between the conductive lines in the open field but conductive material remains in the dense array between the conductive lines; etching, in a second etching step, at the reduced second chlorine gas flow rate until the conductive material between the conductive lines in the dense array is substantially completely removed; and etching, in a third etching step, to completely remove any resulting residue between the conductive lines of the dense array, and to remove a portion of the underlying insulating layer in the dense array and open field.

A further aspect of the present invention is an improvement in a conventional method of etching a layer of conductive material on an insulating layer to form a dense array of conductive lines bordered by an open field, wherein etching is conducted with a high density plasma of chlorine generated at a first chlorine gas flow rate, the improvement comprising reducing the first chlorine gas flow rate to a second chlorine gas flow rate when the conductive material is substantially completely removed between the conductive lines in the open field but conductive material remains in the dense array between the conductive lines, etching, in a second etching step, at the reduced second chlorine gas flow rate until the conductive material between the conductive lines of the dense array is substantially completely removed, and etching, in a third etching step, to completely remove any resulting residue between the conductive lines of the dense array, and to remove a portion of the underlying insulating layer in the dense array and open field, thereby substantially avoiding undercutting of the conductive lines in the dense array which would occur at the unreduced chlorine gas flow rate.

Another aspect of the present invention is an improvement in a conventional method of etching a layer of conductive material on an insulating layer to form a dense array of conductive lines bordered by an open field, wherein etching is conducted under a first set of conditions to achieve an initial etching severity, the improvement comprising changing one or more of the first etching conditions to reduce the initial etching severity to a second reduced etching severity when the conductive material is completely removed between the conductive lines in the open field but conductive material remains in the dense array between the conductive lines, etching, in a second etching step, at the second reduced severity until the conductive material between the conductive line of the dense array is substantially completely removed, and etching, in a third etching step, to completely remove any resulting residue between the conductive lines of the dense array, and to remove a portion of the underlying insulating layer in the dense array and open field, thereby substantially avoiding undercutting the conductive lines in the dense array which would occur at the initial etching severity.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
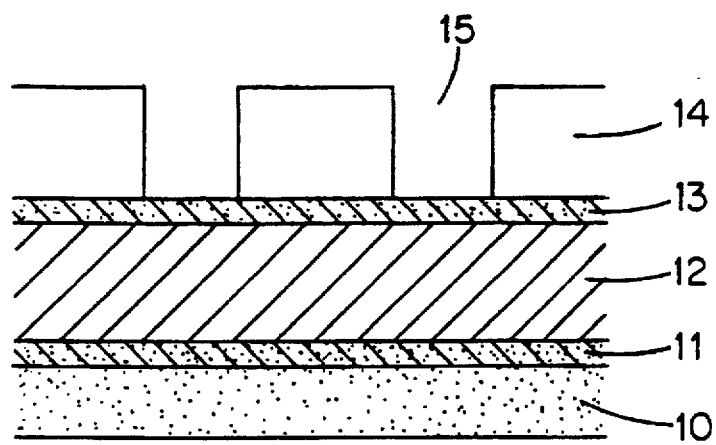
FIGS. 1(a) through 1(d) schematically illustrate a prior art etching process for forming a dense array.
Figure 1B:
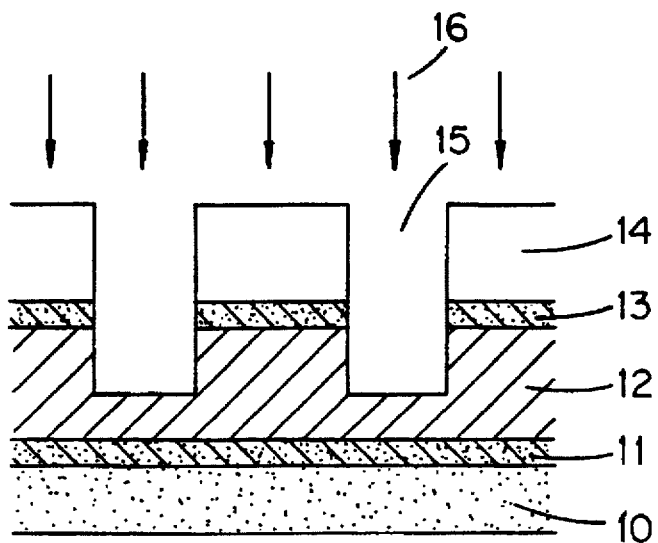

The present invention is directed to solving the undercutting problem which occurs when etching a conductive layer, such as a metal layer, to form a dense array of conductive lines separated by distances less than 1.0 micron, preferably less than 0.7 microns, employing a conventional etching technique, such as high density chlorine plasma etching. As shown in FIG. 1(c) undercutting of conductive (metal) layer 12 occurs at 17. The present invention avoids the undercutting problem by reducing the initial etching severity by changing one or more of the initial etching conditions at a strategic point in the etching process. Those having ordinary skill in the art are aware of and capable of adjusting any of various etching conditions which affect the aggressiveness or severity of the etching process in order to obtain a second reduced etching severity to avoid undercutting the conductive lines of a dense array in practicing the present inventions. In a preferred embodiment, employing a high density chlorine plasma etching technique, the initial flow rate of chlorine gas to the etching apparatus is reduced at a strategic point in the etching process.

The present invention stems from the discovery that the etching rate of conductive material, such as metal, in an open field is faster than the etching rate of the conductive material in a dense array. As employed throughout this application, the expression "open field" denotes an area wherein conductive lines are separated by a distance of at least 2 microns, while the expression "dense array" denotes a pattern of conductive lines which are separated by a distance of less than 1.0 micron.

Upon further investigation, we discovered that undercutting of conductive lines in a dense array begins at about the time that the conductive material is completely removed between the conductive lines in the open field and etching of a portion of the underlying oxide in the open field commences. In accordance with the preferred embodiment of the present invention, etching is conducted at a first chlorine gas flow rate to a high density plasma etching apparatus, which first chlorine gas flow rate is normally optimized for speed. The etching process is monitored in a conventional manner, as by optical spectrum monitoring, until the conductive material, preferable a metal, is substantially removed from the open field between conductive lines, but conductive material remains between the conductive lines of the dense array. It is at about this point that undercutting of the conductive lines in the dense array commences. Therefore, the first chlorine gas flow rate is reduced at about the point when the conductive material is substantially completely removed from the open field between conductive lines, but conductive material remains in the dense array between the conductive lines to a second reduced chlorine gas flow rate. Etching is then conducted, in a second etching step, at the second reduced chlorine gas flow rate to substantially completely remove the remaining conductive material between the conductive lines in the dense array without undercutting such conductive lines. Etching is then conducted, in a third etching step, to completely remove any resulting residue between the conductive lines of the dense array and to remove a portion of the underlying oxide in the dense array and open field without experiencing undercutting of the conductive lines in the dense array. By reducing the chlorine gas flow rate to the high density plasma etching apparatus, the severity of the high density chlorine plasma etching, in the second etching step, is reduced, since chlorine is the etching species. Etching in the third etching step need not be conducted at the second reduced chlorine gas flow rate, but is, preferably, conducted at the first chlorine gas flow rate for optimum production efficiency. However, the third etching step can also be performed at the second reduced chlorine gas flow rate.

Basically, the method of the present invention is similar to conventional methods of etching a conductive layer to form a dense array of conductive lines in terms of materials, equipment, and basic manipulative steps. The present invention departs from conventional practices by, inter alia, reducing the initial etching severity, by changing one or more of the initial etching conditions, when the conductive material is substantially completely removed between the conductive lines in the open field, but conductive material remains between the conductive lines in the dense array. In the preferred high density chlorine plasma etching process, the initial chlorine gas flow rate to the high density plasma etching apparatus is reduced when the conductive material is substantially completely removed between conductive lines in the open field, but conductive material remains between the conductive lines in the dense array.

Thus, the present invention is generally applicable to the formation of a dense array of conductive lines, preferably comprising a metal, on an insulating layer formed on a semiconductor substrate. The substrates may be any conventional semiconductor substrate, such as monocrystalline silicon. The insulating layer can be formed by any conventional deposition technique, such as chemical vapor deposition or sputtering, and can comprise any insulating material typically employed in the production of semiconductor devices, such as an oxide, preferably silicon dioxide. The conductive layer can be formed by any conventional deposition technique, such as chemical vapor deposition or sputtering, and can comprise any conventional conductive material normally employed in the production of semiconductor devices, such as aluminum or an alloy, preferably an alloy containing titanium, copper and silicon, tungsten, tungsten silicide or polycrystalline silicon.

The present invention is applicable to any conventional etching technique for forming a dense array of conductive lines bordered by an open field wherein the etching rate of the conductive material in the open field is greater than the etching rate of the conductive material in the dense array. In the preferred embodiment, high density chlorine plasma etching is conducted utilizing conventional high density chlorine plasma etching equipment, such as Model 9600 commercially available from LAM Research Corp., Fremont, Calif.

In a preferred aspect of the present invention, a conductive barrier layer is initially deposited on the underlying insulating layer, and a second conductive material, preferably a metal such as aluminum or an aluminum alloy, is deposited on the barrier layer. The barrier layer can be deposited by any conventional technique, such as chemical vapor deposition or physical vapor deposition, and can comprise any material conventionally employed for that purpose, such as titanium.

Another preferred aspect of the present invention comprises the formation of an anti-reflective coating on the second metal. The anti-reflective coating can be deposited by any conventional technique, such as chemical vapor deposition or physical vapor deposition, and can be any material conventionally employed for that purpose, such as titanium nitride.

In conducting the preferred embodiment of present invention, the first chlorine gas flow rate is that conventionally employed for etching conductive patterns for optimal speed, typically about 50 cc/min. to about 100 cc/min. Etching of the conductive layer is conducted with a high density chlorine plasma generated by feeding chlorine gas, and usually boron trichloride, to the high density etching apparatus at the first chlorine gas flow rate until the conductive material is substantially completely removed between the conductive lines in the open field, but conductive material remains between the conductive lines of the dense array, at which point the first chlorine gas flow rate is reduced to a second chlorine gas flow rate. High density chlorine plasma etching is then conducted in a second etching step at the second chlorine gas flow rate until the conductive material between the conductive lines in the dense array is substantially completely removed. Etching is then conducted in a third etching step, preferably at the initial chlorine gas flow rate, to completely remove any resulting residues between the conductive lines of the dense array, and to remove a portion of the underlying insulating layer in the dense array and open field. The optimum reduced second chlorine gas flow rate is selected to avoid undercutting conductive lines in the dense array while removing the desired materials at a desirable rate. It has been found that a reduced second chlorine gas flow rate of less than about 50 cc/min., preferably between about 10 and about 40 cc/min., most preferably to about 30 cc/min, achieves that objective.

Typically, the anti-reflective coating has a thickness up to about 1100 Å; the barrier layer a thickness of about 250 to about 1000 Å, and the second metal layer, such as aluminum or an aluminum alloy, a thickness of about 4000 to about 15000 Å.

It is also within the scope of the present invention to employ a composite barrier film of titanium and titanium nitride. In such an embodiment, the titanium barrier layer can have a thickness of about 250 Å and the titanium nitride layer a thickness of about 600 Å.

EXAMPLE

Figure 1C:
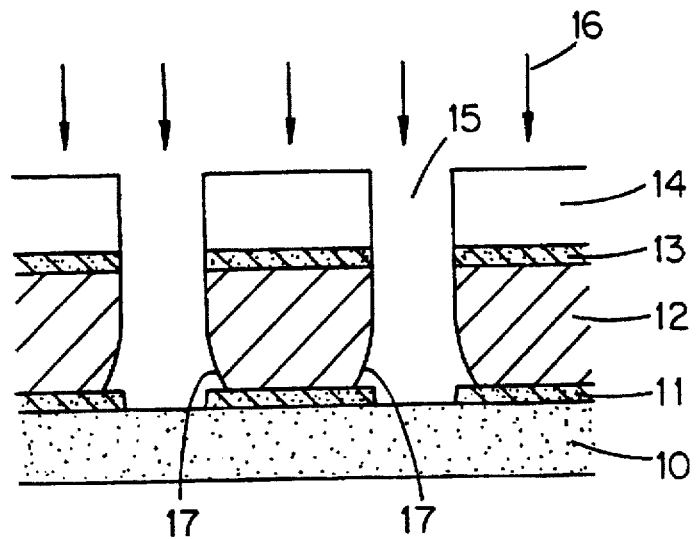
Figure 1D:
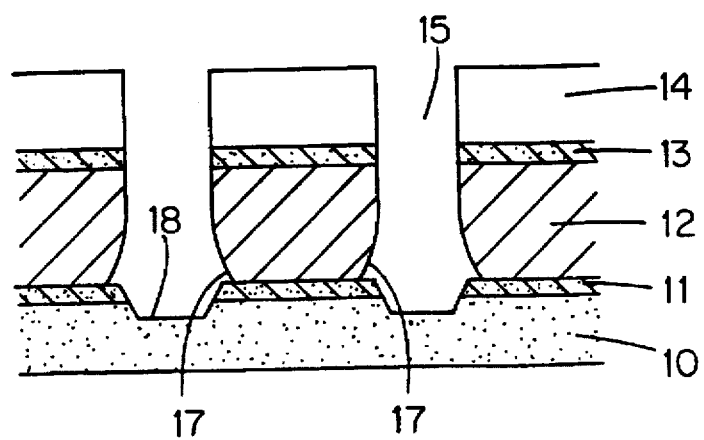
Figure 2A:
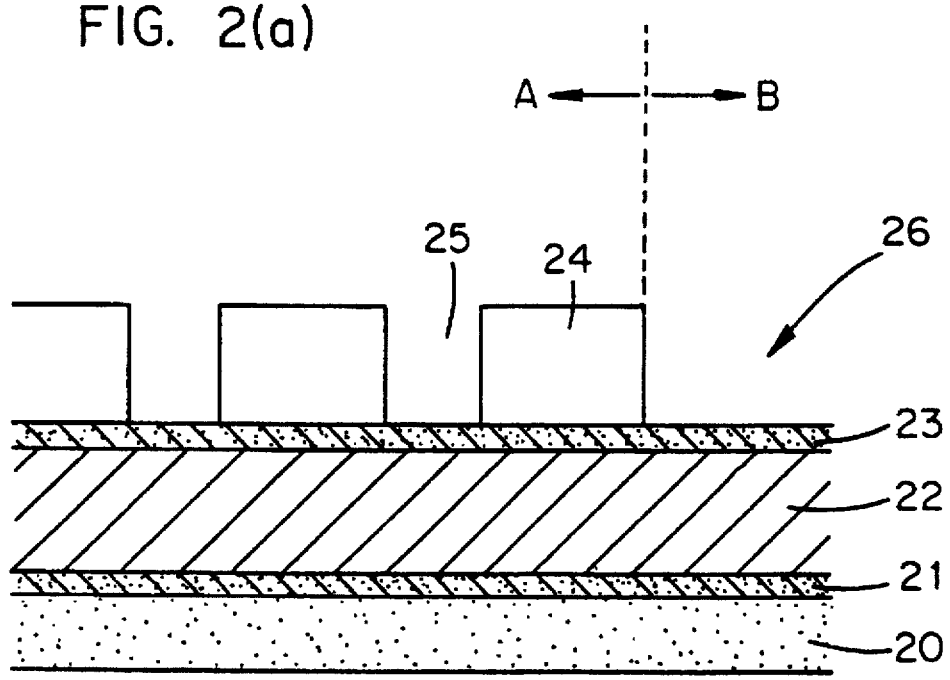
FIGS. 2(a) through 2(d) schematically illustrate an embodiment of the present invention wherein undercutting is avoided.

An embodiment of the present invention is illustrated in FIGS. 2(a) through 2(d), wherein FIG. 2(a) is similar to FIG. 1(a) except that the open field 26 is depicted. A silicon dioxide layer 20 is formed on a semiconductor substrate (not shown), and a titanium barrier layer 21 formed on silicon dioxide layer 20. An aluminum alloy layer 22 is formed on titanium barrier layer 21, and titanium nitride anti-reflective coating 23 formed on aluminum alloy layer 22. A photoresist mask 24 is formed on the anti-reflective coating containing a pattern 25 which defines a dense array of conductive lines. The dense array extends in the direction of arrow A; whereas, the open field extends in the direction of arrow B and is generally indicated by the numeral 26. The titanium layer 20 has a thickness of 300 Å, and the aluminum alloy layer 22 has a thickness of about 6500 Å. The aluminum alloy is a conventional aluminum alloy containing copper and silicon which is conventionally employed for producing conductive lines. The titanium nitride anti-reflective coating has a thickness of about 350 Å.

Figure 2B:
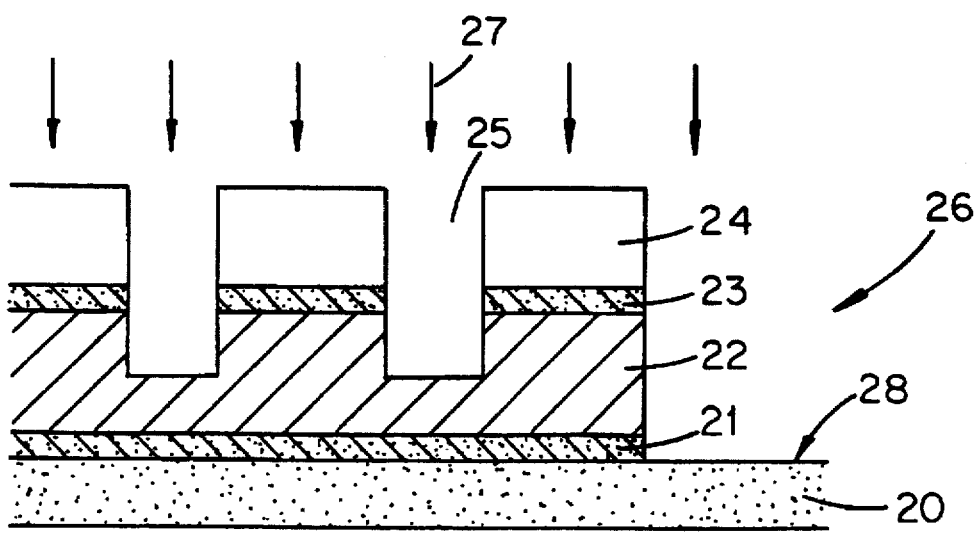

As in the conventional high density chlorine plasma etching process, etching is initially conducted by feeding chlorine gas to the high density plasma apparatus at a first chlorine gas flow rate of about 60 cc/min. illustrated in FIG. 2(b) by reference numeral 27.

Figure 2C:
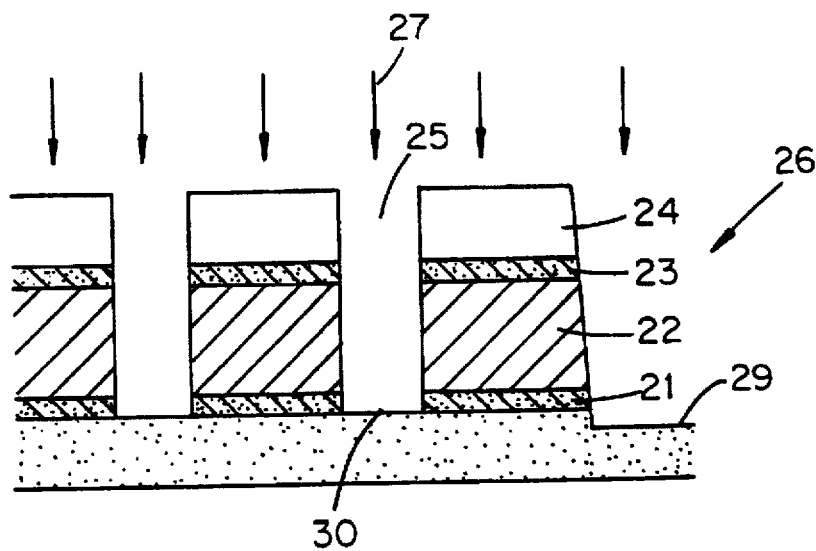
Figure 2D:
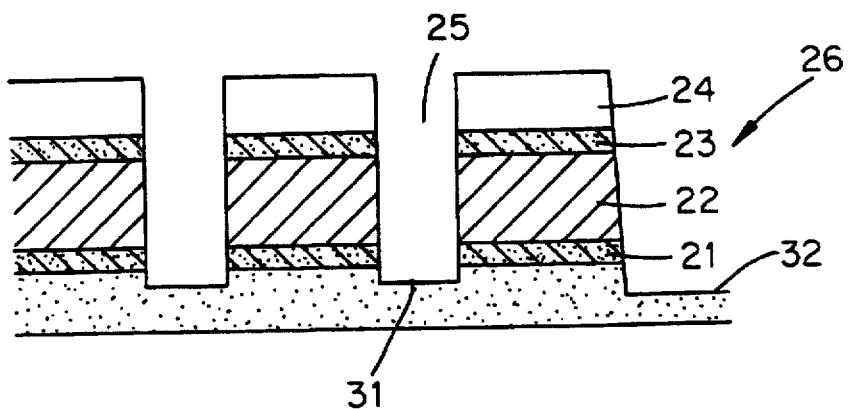

As shown in FIG. 2(b), the etching rate of the conductive material in the open field is faster than the etching rate of the conductive material in the dense array. In accordance with the present invention, when the conductive material is substantially completely removed between the conductive lines in the open field, as shown at point 28, but conductive material remains between the conductive lines in the dense array, the first chlorine gas flow rate to the high density plasma etching apparatus is reduced to about 30 cc/min. As illustrated in FIG. 2(c), high density chlorine plasma etching is conducted in a second etching step at the second reduced chlorine gas flow rate to substantially completely remove the conductive material between the conductive lines in the dense array, as at point 30. Etching is then conducted in a third etching step at the first chlorine gas flow rate of 60 cc/min. to completely remove any resulting residue between the conductive lines of the dense array and to remove a portion of the underlying oxide between the conductive lines in the dense array 25, as at point 31 in FIG. 2(d), and in the open field 26, as at point 32.

Upon microscopic examination of the resulting etched dense array, it was observed that the conductive lines were essentially free of any undercutting. Thus, in accordance with the present invention, undercutting of conductive lines, separated by a distance less than 1.0 micron, within a dense array, bordered by an open field wherein the conductive lines are separated by a distance of at least about 2 microns, is avoided during high speed, high density chlorine plasma etching by reducing the chlorine gas flow rate to the high density plasma etching apparatus when the conductive material is substantially completely removed between the conductive lines in the open field, but conductive material remains between the conductive lines in the dense array.

The present invention is applicable to various phases in the production of semiconductor devices comprising the formation of dense arrays of conductive lines separated by distances less than about 1.0 micron, preferably less than 0.7 microns and bordered by an open field having conductive lines separated by distances of at least about 2 microns. The present invention is applicable to any etching technique for forming a dense array of conductive lines bordered by an open field, wherein the etching rate of the conductive material in the open field is greater than the etching rate of the conductive material in the dense array. The present invention is not limited to the particular materials previously mentioned or exemplified, but enjoys utility in the formation of any type of dense array comprising conductive lines.

Only the preferred embodiment of the invention and an example of its versatility is shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having a dense array of conductive lines, comprising:

forming an insulating layer;

forming a layer of conductive material on the insulating layer;

forming a mask on the conductive layer, which mask contains a pattern comprising a dense array of conductive lines bordered by an open field;

etching the conductive layer, in a first etching step, through the mask with a high density plasma of chlorine generated at a first chlorine gas flow rate until the conductive material is substantially completely removed between the conductive lines in the open field but conductive material remains in the dense array between the conductive lines;

reducing the first chlorine gas flow rate to a second chlorine gas flow rate when the conductive material is substantially removed from the open field but conductive material remains in the dense array between the conductive lines;

etching, in a second etching step, at the reduced second chlorine gas flow rate to until the conductive material between the conductive lines in the dense array is substantially completely removed; and etching, in a third etching step, to completely remove any resulting residue between the conductive lines of the dense array, and to remove a portion of the underlying insulating layer from the dense array and open field.

2. The method according to claim 1, wherein the second chlorine gas flow rate is selected to avoid undercutting of the conductive lines which would result at the first flow rate of chlorine gas.

3. The method according to claim 1, wherein the third etching step is conducted at the first chlorine gas flow rate.

4. The method according to claim 1, wherein the insulating layer comprises an oxide.

5. The method according to claim 1, wherein the conductive material comprises a metal.

6. The method according to claim 5, wherein the metal is aluminum or an aluminum alloy.

7. The method according to claim 5, further comprising: forming a first metal barrier layer on the insulating layer; and forming a second metal layer on the barrier layer.

8. The method according to claim 7, wherein the first metal is titanium.

9. The method according to claim 7, wherein the second metal is aluminum or an aluminum alloy.

10. The method according to claim 9, wherein the second metal is an aluminum alloy containing titanium, copper and silicon.

11. The method according to claim 7, further comprising: forming an anti-reflective coating on the second metal layer.

12. The method according to claim 9, further comprising: forming an anti-reflective coating on the metal layer.

13. The method according to claim 12, wherein the anti-reflective coating is titanium nitride.

14. The method according to claim 1, wherein the first chlorine gas flow rate is about 50 cc/min. to about 100 cc/min.

15. The method according to claim 1, wherein the second chlorine gas flow rate is less than about 40 cc/min.

16. The method according to claim 15, wherein the second chlorine gas flow rate is about 10 to about 40 cc/min.

17. The method according to claim 16, wherein the second chlorine gas flow rate is about 30 cc/min.

18. The method according to claim 1, wherein the distance between the conductive lines in the dense array is less than about 0.7 microns.

19. The method according to claim 1, wherein the third etching step is conducted at the second reduced chlorine gas flow rate.

20. In a method of manufacturing a semiconductor device comprising etching a layer of conductive material on an insulating layer to form a dense array of conductive lines bordered by an open field, wherein etching is conducted with a high density plasma of chlorine generated at a first chlorine gas flow rate, the improvement comprising:

reducing the chlorine gas flow rate to a second chlorine gas flow rate when the conductive material is substantially completely removed between the conductive lines in the open field but conductive material remains in the dense array between the conductive lines;

etching, in a second etching step, at the reduced second chlorine gas flow rate until the conductive material between the conductive lines of the dense array is substantially completely removed; and etching, in a third etching step, to completely remove any resulting residue between the conductive lines of the dense array, and to remove a portion of the underlying insulating layer in the dense array and open field, thereby substantially avoiding undercutting the conductive lines in the dense array which would occur at the unreduced chlorine gas flow rate.

21. The method according to claim 20, comprising etching in the third etching step at the first chlorine gas flow rate.

22. The method according to claim 20, wherein the distance between the conductive lines in the dense array is less than about 0.7 microns.

23. The method according to claim 20, wherein the third etching step is conducted at the second reduced chlorine gas flow rate.

24. In a method of manufacturing a semiconductor device comprising etching under a first set of conditions to achieve an initial etching severity, a layer of conductive material on an insulating layer to form a dense array of the conductive lines bordered by an open field, the improvement comprising:

changing one or more of the first etching conditions to reduce the initial etching severity to a second reduced etching severity when the conductive material is substantially completely removed between the conductive lines in the open field but conductive material remains in the dense array between the conductive lines;

etching, in a second etching step, at the second reduced severity until the conductive material between the conductive lines in the dense array is completely removed; and etching, in a third etching step, to completely remove any resulting residue between the conductive lines of the dense array, and to remove a portion of the underlying insulating layer in the dense array and open field, thereby substantially avoiding undercutting the conductive lines in the dense array which would occur at the initial etching severity.

25. The method according to claim 24, comprising etching in the third etching step at the initial etching severity.

26. The method according to claim 24, wherein the distance between conductive lines in the dense array is less than about 0.7 microns.

27. The method according to claim 24, wherein the third etching step is conducted at the second reduced chlorine gas flow rate.

* * * * *